(12) United States Patent
Holt et al.

(10) Patent No.: US 10,900,277 B1
(45) Date of Patent: Jan. 26, 2021

(54) MONOLITHIC ELECTROCHROMIC WINDOW MANUFACTURING METHODS

(71) Applicant: HELIOTROPE TECHNOLOGIES, INC., Alameda, CA (US)

(72) Inventors: Jason Holt, Larkspur, CA (US); Guillermo Garcia, Oakland, CA (US); Scott Thomsen, South Lyon, MI (US)

(73) Assignee: HELIOTROPE TECHNOLOGIES, INC., Alameda, CA (US)

( * ) Notice: Subject to any disclaimer, the term of this patent is extended or adjusted under 35 U.S.C. 154(b) by 0 days.

(21) Appl. No.: 15/789,189

(22) Filed: Oct. 20, 2017

Related U.S. Application Data

(60) Provisional application No. 62/411,891, filed on Oct. 24, 2016.

(51) Int. Cl.
| | |
|---|---|
| *C23C 18/12* | (2006.01) |
| *C23C 16/50* | (2006.01) |
| *C23C 14/08* | (2006.01) |
| *C23C 14/34* | (2006.01) |
| *G02F 1/1343* | (2006.01) |
| *E06B 3/677* | (2006.01) |
| *G02F 1/1506* | (2019.01) |
| *G02F 1/1523* | (2019.01) |
| *G02F 1/155* | (2006.01) |
| *E06B 9/24* | (2006.01) |

(52) U.S. Cl.
CPC .......... *E06B 3/6775* (2013.01); *C23C 14/086* (2013.01); *C23C 14/34* (2013.01); *C23C 16/50* (2013.01); *C23C 18/1254* (2013.01); *G02F 1/13439* (2013.01); *G02F 1/155* (2013.01); *G02F 1/1506* (2013.01); *G02F 1/1525* (2013.01); *E06B 2009/2464* (2013.01); *G02F 2202/38* (2013.01)

(58) Field of Classification Search
CPC ........... E06B 3/6775; E06B 2009/2464; C23C 14/086; C23C 14/34; C23C 16/50; G02F 1/13439; G02F 1/1506; G02F 1/1524; G02F 1/155; G02F 2202/38
See application file for complete search history.

(56) References Cited

U.S. PATENT DOCUMENTS

| | | | | |
|---|---|---|---|---|
| 6,466,355 | B1 * | 10/2002 | Berneth | B82Y 20/00 359/265 |
| 6,538,792 | B1 * | 3/2003 | Kobayashi | C09K 9/02 359/265 |
| 7,808,693 | B2 * | 10/2010 | Nguyen | G02F 1/1508 359/270 |
| 9,684,219 | B2 | 6/2017 | Garcia et al. | |

(Continued)

OTHER PUBLICATIONS

Lee et al. "Solution-Processed Metal Nanowire Mesh Transparent Electrodes" (2008). Nano Letters 8 (2), 689-692 (Year: 2008).*

*Primary Examiner* — Jose I Hernandez-Kenney
(74) *Attorney, Agent, or Firm* — The Marbury Law Group PLLC

(57) ABSTRACT

A monolithic method of forming an electrochromic (EC) pane unit, the method including: forming a first electrode via a solution deposition process, on a first conductive layer disposed on a transparent first substrate, forming an electrolyte layer on the first electrode via a sol-gel process, forming a second electrode on the electrolyte layer via a solution deposition process, and forming a second conductive layer on the second electrode.

10 Claims, 8 Drawing Sheets

(56) References Cited

U.S. PATENT DOCUMENTS

| | | | |
|---|---|---|---|
| 2007/0097481 A1* | 5/2007 | Burdis | G02F 1/1525 359/265 |
| 2008/0128287 A1* | 6/2008 | Wu | B82Y 20/00 205/109 |
| 2013/0278989 A1* | 10/2013 | Lam | B60J 3/04 359/275 |
| 2015/0099325 A1* | 4/2015 | Illiberi | C09C 3/063 438/95 |
| 2015/0277202 A1 | 10/2015 | Mattox et al. | |
| 2016/0139475 A1 | 5/2016 | Garcia et al. | |
| 2016/0139476 A1 | 5/2016 | Garcia et al. | |
| 2016/0246153 A1 | 8/2016 | Garcia et al. | |
| 2017/0097551 A1 | 4/2017 | Garcia et al. | |
| 2017/0219904 A1 | 8/2017 | Garcia et al. | |
| 2017/0219905 A1 | 8/2017 | Garcia et al. | |

* cited by examiner

MONOLITHIC ELECTROCHROMIC WINDOW MANUFACTURING METHODS

FIELD

The present invention is generally directed to monolithic methods of manufacturing electrochromic (EC) pane units.

BACKGROUND OF THE INVENTION

Residential and commercial buildings represent a prime opportunity to improve energy efficiency and sustainability in the United States. The buildings sector alone accounts for 40% of the United States' yearly energy consumption (40 quadrillion BTUs, or "quads", out of 100 total), and 8% of the world's energy use. Lighting and thermal management each represent about 30% of the energy used within a typical building, which corresponds to around twelve quads each of yearly energy consumption in the US. Windows cover an estimated area of about 2,500 square km in the US and are a critical component of building energy efficiency as they strongly affect the amount of natural light and solar gain that enters a building. Recent progress has been made toward improving window energy efficiency through the use of inexpensive static coatings that either retain heat in cold climates (low emissive films) or reject solar heat gain in warm climates (near-infrared rejection films).

Currently, static window coatings can be manufactured at relatively low cost. However, these window coatings are static and not well suited for locations with varying climates. A window including an electrochromic (EC) device overcomes these limitations by enhancing window performance in all climates.

However, one of the shortcomings of conventional EC windows is the inability to achieve a sufficiently dark state to allow for use in privacy applications. Accordingly, there is a need for smart windows suitable for privacy applications.

SUMMARY

According to various embodiments, a monolithic method of forming an electrochromic (EC) pane unit comprises: forming a first electrode via a solution deposition process, on a first conductive layer disposed on a transparent first substrate; forming an electrolyte layer on the first electrode via a sol-gel process; forming a second electrode on the electrolyte layer via a solution deposition process; and forming a second conductive layer on the second electrode.

According to various embodiments, an EC pane unit formed by the above method is provided.

According to various embodiments, an EC window including the above EC pane unit is provided.

DETAILED DESCRIPTION OF THE EXEMPLARY EMBODIMENTS

Figure 1A:
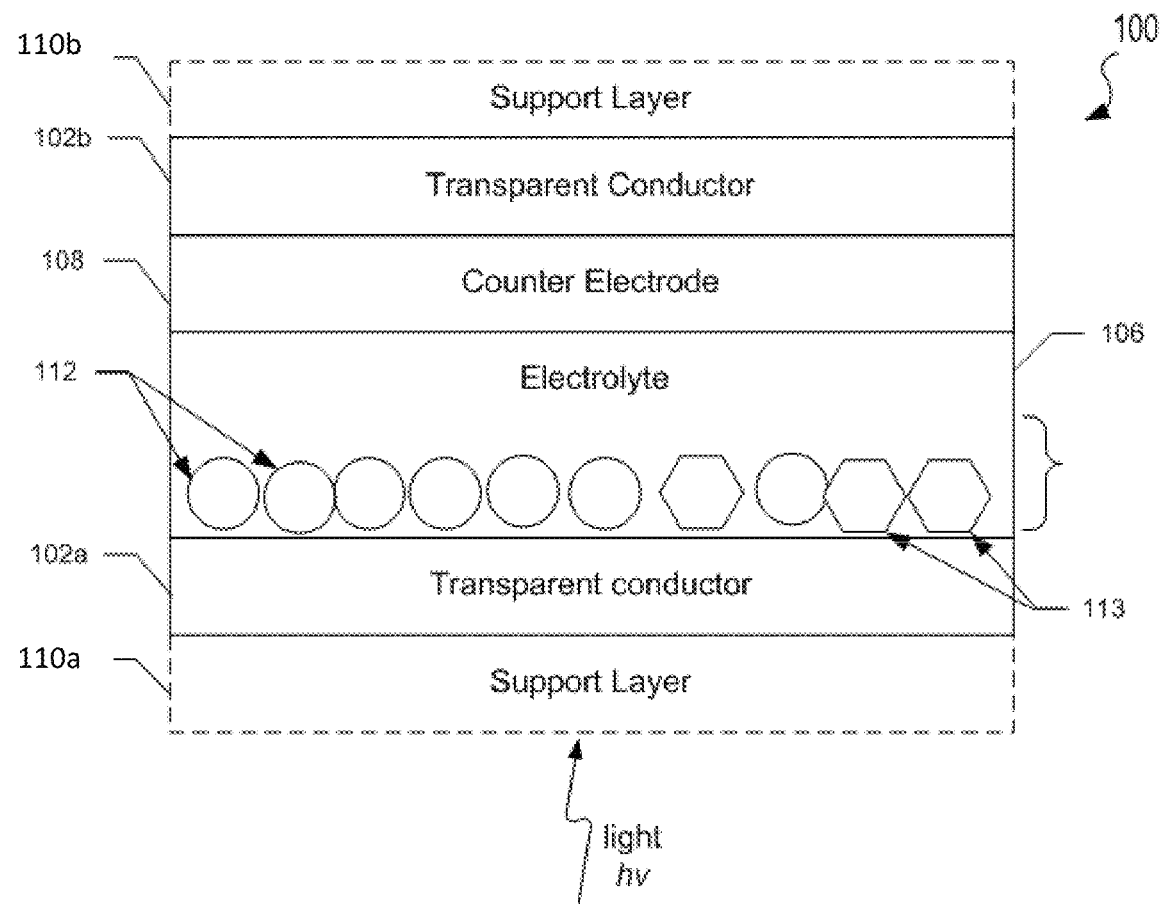
FIGS. 1A-1C are schematic representations of EC devices according to various embodiments.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being disposed "on" or "connected to" another element or layer, it can be directly on or directly connected to the other element or layer, or intervening elements or layers may be present. In contrast, when an element is referred to as being disposed "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Various embodiments disclosed herein provide electrochromic nanostructured materials capable of selectively modulating radiation in near-infrared (NIR) and visible spectral regions. The material may include nanostructured doped transition metal oxides with ternary compounds of the type $A_xM_zO_y$. In various embodiment $A_xM_zO_y$ compounds, if it is assumed that $z=1$, then $0.08 \le x \le 0.5$ (preferably $0.25 \le x \le 0.35$), and $2 \le y \le 3$. In various embodiments, since the nanostructures may be non-uniform as a function of depth, x may represent an average doping content. To operate, the subject material may be fabricated into an electrode that will change optical properties after driven by an applied voltage.

In order to improve the performance of EC window coatings, selective modulation of NIR and visible spectra radiation, and avoidance of degrading effects of UV radiation, may be desired. Various embodiments may provide single-component electrochromic nanostructured materials capable of selectively modulating NIR and visible spectral regions. Further, since certain spectral regions may damage the electrochromic nanostructured material, the various embodiments may incorporate at least one protective material and/or protective layer to prevent such damage.

The various embodiments provide devices and methods for enhancing optical changes in windows using electrochromic nanostructured materials fabricated into an electrode to form an electrochromic device. In various embodiments, the material may undergo a reversible change in optical properties when driven by an applied potential. Based on the applied potential, the electrochromic nanostructured materials may modulate NIR radiation (wavelength of around 780-2500 nm), as well as visible radiation (wavelength of around 400-780 nm). In an example, the device may include a first nanostructured material that modulates radiation in a portion of the NIR spectral region and in the visible spectral region, and a second nanostructured material that modulates radiation in an overlapping portion of the NIR spectral region such that the NIR radiation modulated by the device as a whole is enhanced and expanded relative to that of just the first nanostructured material. In various embodiments, the material may operate in multiple selective modes based on the applied potential.

Further, the various embodiments may include at least one protective material to prevent or reduce damage to an electrochromic nanostructured material that may result from repeated exposure to radiation in the UV spectral region. In an example, a protective material may be used to form at least one barrier layer in the device that is positioned to block UV radiation from reaching the first nanostructured material and electrolyte. In another example, a protective material may be used to form a layer that is positioned to block free electron or hole charge carriers created in the electrolyte due to absorption of UV radiation by the nanostructured electrode material from migrating to that material, while allowing conduction of ions from the electrolyte (i.e., an electron barrier and ion conductor).

In various embodiments, control of individual operating modes for modulating absorption/transmittance of radiation in specific spectral regions may occur at different applied biases. Such control may provide users with the capability to achieve thermal management within buildings and other enclosures (e.g., vehicles, etc.), while still providing shading when desired.

Figure 1B:
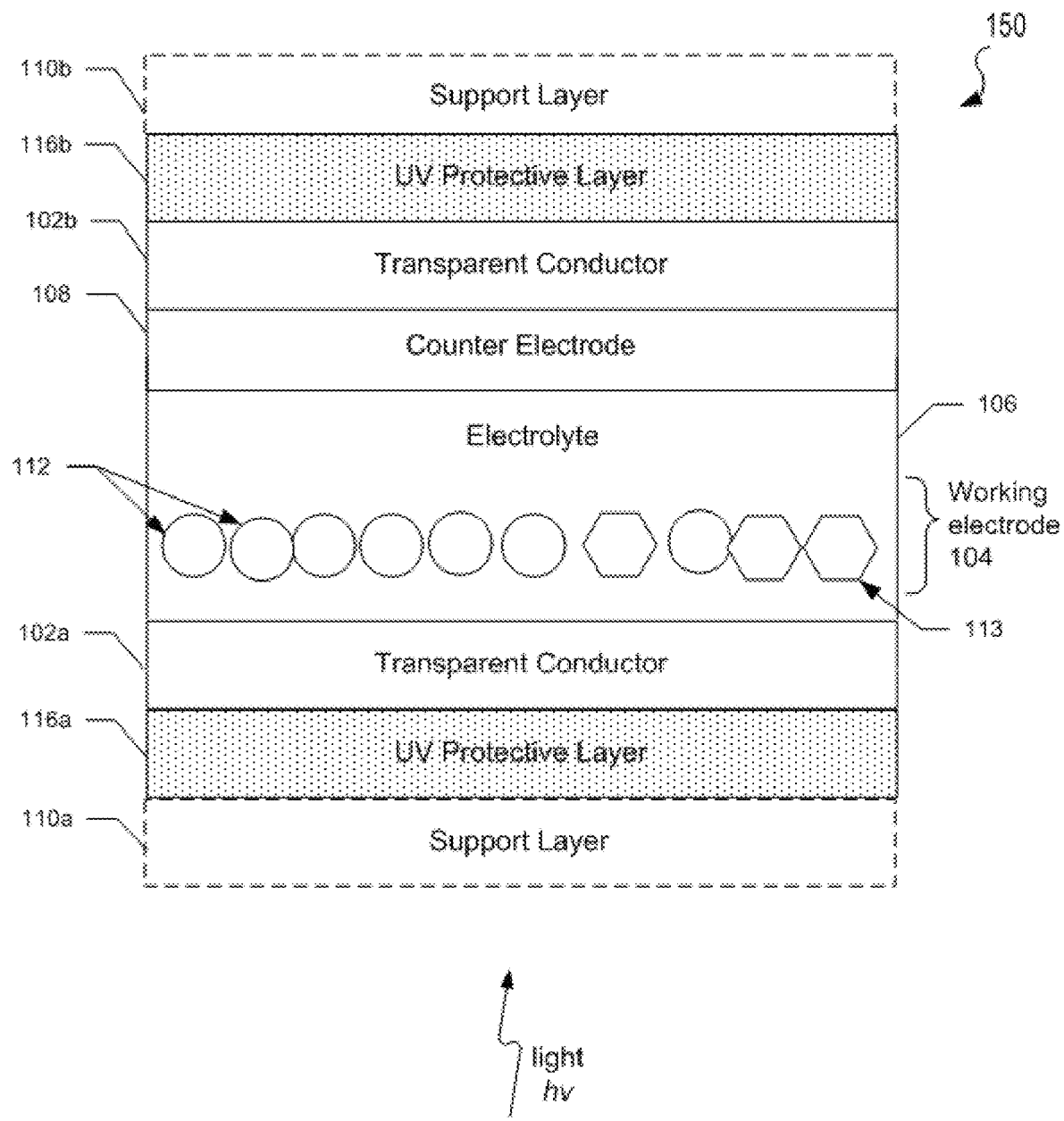
Figure 1C:
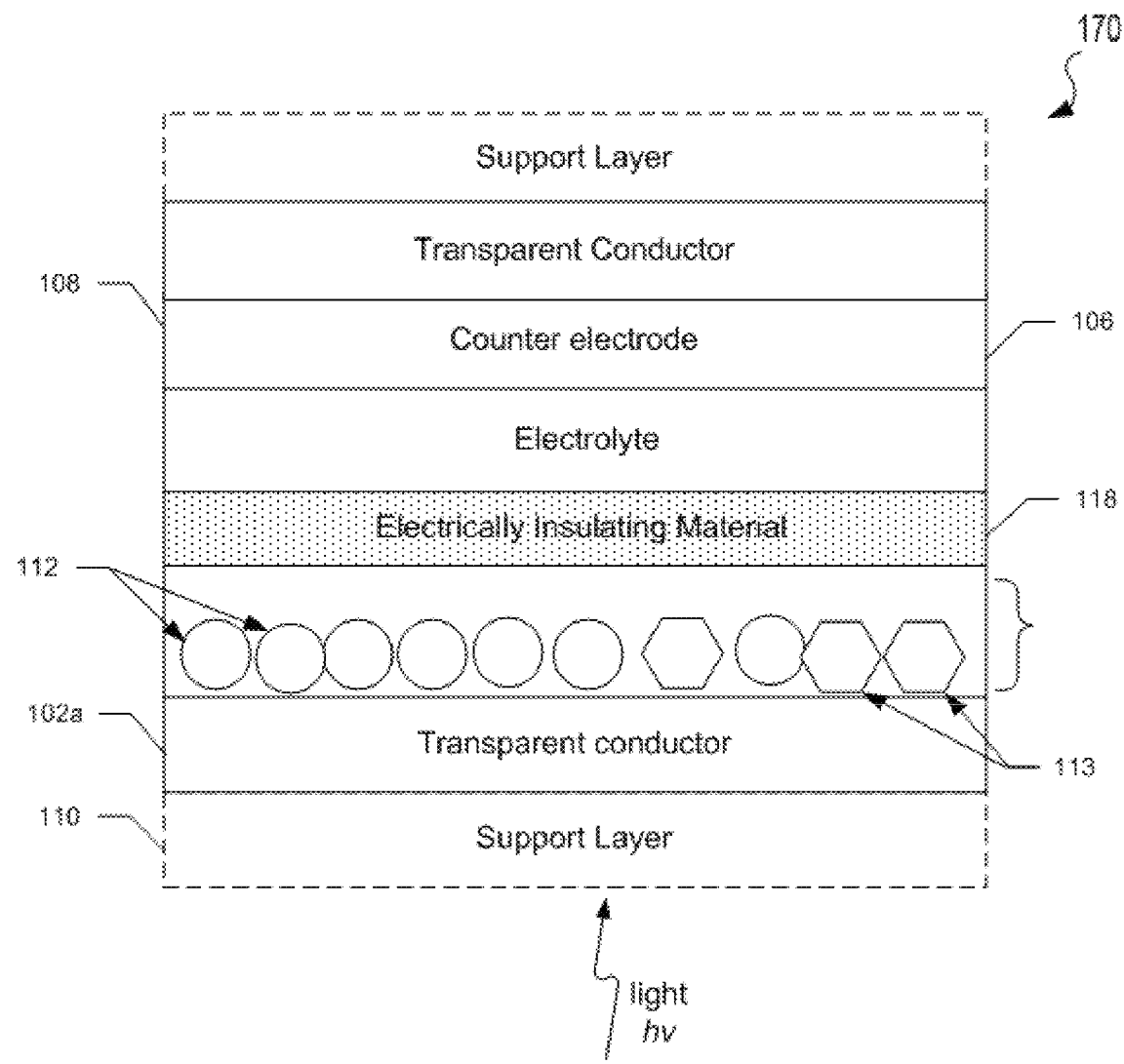

FIGS. 1A-1C illustrate embodiment electrochromic devices. It should be noted that such electrochromic devices may be oriented upside down or sideways from the orientations illustrated in FIGS. 1A-1C. Furthermore, the thickness of the layers and/or size of the components of the devices in FIGS. 1A-1C are not drawn to scale or in actual proportion to one another other, but rather are shown as representations.

In FIG. 1A, an embodiment electrochromic device 100 may include a first transparent conductor layer 102*a*, a working electrode 104, a solid state electrolyte 106, a counter electrode 108, and a second transparent conductor layer 102*b*. Some embodiment electrochromic devices may also include one or more optically transparent support layers 110*a*, 110*b* respectively positioned in front of the first transparent conductor layer 102*a* and/or positioned behind the second transparent conductor layer 102*b*. The support layers 110*a*, 110*b* may be formed of a transparent material such as glass or plastic.

The first and second transparent conductor layers 102*a*, 102*b* may be formed from transparent conducting films fabricated using inorganic and/or organic materials. For example, the transparent conductor layers 102*a*, 102*b* may include inorganic films of transparent conducting oxide (TCO) materials, such as indium tin oxide (ITO) or fluorine doped tin oxide (FTO). In other examples, organic films in transparent conductor layers 102*a*, 102*b* may include graphene and/or various polymers.

In the various embodiments, the working electrode 104 may include nanostructures 112 of a doped or undoped transition metal oxide bronze, and optionally nanostructures 113 of a transparent conducting oxide (TCO) composition shown schematically as circles and hexagons for illustration purposes only. As discussed above, the thickness of the layers of the device 100, including and the shape, size and scale of nanostructures is not drawn to scale or in actual proportion to each other, but is represented for clarity. In the various embodiments, nanostructures 112, 113 may be embedded in an optically transparent matrix material or provided as a packed or loose layer of nanostructures exposed to the electrolyte.

In the various embodiments, the doped transition metal oxide bronze of nanostructures 112 may be a ternary composition of the type AxMzOy, where M represents a transition metal ion species in at least one transition metal oxide, and A represents at least one dopant. Transition metal oxides that may be used in the various embodiments include, but are not limited to any transition metal oxide which can be reduced and has multiple oxidation states, such as niobium oxide, tungsten oxide, molybdenum oxide, vanadium oxide, titanium oxide and mixtures of two or more thereof. In one example, the nanostructured transition metal oxide bronze may include a plurality of undoped tungsten oxide ($WO_{3-x}$) nanoparticles, where $0 \le x \le 0.33$, such as $0 \le x \le 0.1$.

In various embodiments, the at least one dopant species may be a first dopant species that, upon application of a particular first voltage range, causes a first optical response. The applied voltage may be, for example, a negative bias voltage. Specifically, the first dopant species may cause a surface plasmon resonance effect on the transition metal oxide by creating a significant population of delocalized electronic carriers. Such surface plasmon resonance may cause absorption of NIR radiation at wavelengths of around 780-2000 nm, with a peak absorbance at around 1200 nm. In various embodiments, the specific absorbances at different wavelengths may be varied/adjusted based other factors (e.g., nanostructure shape, size, etc.), discussed in further detail below. In the various embodiments, the first dopant species may be an ion species selected from the group of cesium, rubidium, and lanthanides (e.g., cerium, lanthanum, praseodymium, neodymium, promethium, samarium, europium, gadolinium, terbium, dysprosium, holmium, erbium, thulium, ytterbium, and lutetium).

In various embodiments, the dopant may include a second dopant species that causes a second optical response based upon application of a voltage within a different, second particular range. The applied voltage may be, for example, a negative bias voltage. In an embodiment, the second dopant species may migrate between the solid state electrolyte 106 and the nanostructured transition metal oxide bronze of the working electrode 104 as a result of the applied voltage. Specifically, the application of voltage within the particular range may cause the second dopant species to intercalate and deintercalate the transition metal oxide structure. In this manner, the second dopant may cause a change in the oxidation state of the transition metal oxide, which may cause a polaron effect and a shift in the lattice structure of the transition metal oxide. This shift may cause absorption of visible radiation, for example, at wavelengths of around 400-780 nm.

In various embodiments, the second dopant species may be an intercalation ion species selected from the group of lanthanides (e.g., cerium, lanthanum, praseodymium, neodymium, promethium, samarium, europium, gadolinium, terbium, dysprosium, holmium, erbium, thulium, ytterbium, and lutetium), alkali metals (e.g., lithium, sodium, potassium, rubidium, and cesium), and alkali earth metals (e.g., beryllium, magnesium, calcium, strontium, and barium). In other embodiments, the second dopant species may include a charged proton species.

In various embodiments, nanostructures 113 may optionally be mixed with the doped transition metal oxide bronze nanostructures 112 in the working electrode 104. In the various embodiments, the nanostructures 113 may include at least one TCO composition, which prevents UV radiation from reaching the electrolyte and generating electrons. In an example embodiment, the nanostructures 113 may include an indium tin oxide (ITO) composition, which may be a solid solution of around 60-95 wt % (e.g., 85-90 wt %) indium(III) oxide ($In_2O_3$) and around 5-40 wt % (e.g., 10-15 wt %) tin(IV) oxide ($SnO_2$). In another example embodiment, the nanostructures 113 may include an aluminum-doped zinc oxide (AZO) composition, which may be a solid solution of around 99 wt % zinc oxide (ZnO) and around 2 wt % aluminum(III) oxide ($Al_2O_3$). Additional or alternative TCO compositions that may be used to form nanostructures 113 in the various embodiments include, but are not limited to, indium oxide, zinc oxide and other doped zinc oxides such as gallium-doped zinc oxide and indium-doped zinc oxide.

The TCO composition of nanostructures 113 may be transparent to visible light/radiation and, upon application of the first voltage, may modulate absorption of NIR radiation at wavelengths of around 1200-2500 nm, with peak absorbance around 2000 nm (e.g., at a longer peak wavelength than the bronze nanoparticles 112, but with overlapping absorption bands). In particular, application of the first voltage may cause an increase in free electron charge carriers, and therefore cause a surface plasmon resonance effect in at least one TCO composition of nanostructures 113. In an embodiment in which the TCO composition is ITO, the surface plasmon resonance effect may be caused by oscillation of free electrons produced by the replacement of indium ions ($In^{3+}$) with tin ions ($Sn^{4+}$). Similar to the transition metal oxide bronze, such surface plasmon resonance may cause a change in absorption properties of the TCO material. In some embodiments, the change in absorption properties may be an increase in absorbance of NIR radiation at wavelengths that overlaps with that of the nanostructures 112. Therefore, the addition of TCO composition nanostructures 113 to the working electrode 104 may serve to expand the range of NIR radiation absorbed (e.g., at wavelengths of around 780-2500 nm) compared to that of the nanostructures 112 alone (e.g., at wavelengths of around 780-2000 nm), and to enhance absorption of some of that NIR radiation (e.g., at wavelengths of around 1200-2000 nm).

Based on these optical effects, the nanostructure 112 and optional nanostructure 113 of the working electrode may progressively modulate transmittance of NIR and visible radiation as a function of applied voltage by operating in at least three different modes. For example, a first mode may be a highly solar transparent ("bright") mode in which the working electrode 104 is transparent to NIR radiation and visible light radiation. A second mode may be a selective-IR blocking ("cool") mode in which the working electrode 104 is transparent to visible light radiation but absorbs NIR radiation. A third mode may be a visible blocking ("dark") mode in which the working electrode 104 absorbs radiation in the visible spectral region and at least a portion of the NIR spectral region. In an example, application of a first voltage having a negative bias may cause the electrochromic device to operate in the cool mode, blocking transmittance of NIR radiation at wavelengths of around 780-2500 nm. In another example, application of a second negative bias voltage having a higher absolute value than the first voltage may cause the electrochromic device to operate in the dark state, blocking transmittance of visible radiation (e.g., at wavelengths of around 400-780 nm) and NIR radiation at wavelengths of around 780-1200 nm. In another example, application of a third voltage having a positive bias may cause the electrochromic device to operate in the bright state, allowing transmittance of radiation in both the visible and NIR spectral regions. In various embodiments, the applied voltage may be between −5V and 5V, preferably between −2V and 2V. For example, the first voltage may be −0.25V to −0.75V, and the second voltage may be −1V to −2V. In another example, the absorbance of radiation at a wavelength of 800-1500 nm by the electrochromic device may be at least 50% greater than its absorbance of radiation at a wavelength of 450-600 nm.

Alternatively, the nanostructure 112 and optional nanostructure 113 of the working electrode may modulate transmittance of NIR and visible radiation as a function of applied voltage by operating in two different modes. For example, a first mode may be a highly solar transparent ("bright") mode in which the working electrode 104 is transparent to NIR radiation and visible light radiation. A second mode may be a visible blocking ("dark") mode in which the working electrode 104 absorbs radiation in the visible spectral region and at least a portion of the NIR spectral region. In an example, application of a first voltage having a negative bias may cause the electrochromic device to operate in the dark mode, blocking transmittance of visible and NIR radiation at wavelengths of around 780-2500 nm. In another example, application of a second voltage having a positive bias may cause the electrochromic device to operate in the bright mode, allowing transmittance of radiation in both the visible and NIR spectral regions. In various embodiments, the applied voltage may be between −2V and 2V. For example, the first voltage may be −2V, and the second voltage may be 2V.

In various embodiments, the solid state electrolyte 106 may include at least a polymer material and a plasticizer material, such that electrolyte may permeate into crevices between the transition metal oxide bronze nanoparticles 112 (and/or nanoparticles 113 if present). The term "solid state," as used herein with respect to the electrolyte 106, refers to a polymer-gel and/or any other non-liquid material. In some embodiments, the solid state electrolyte 106 may further include a salt containing, for example, an ion species selected from the group of lanthanides (e.g., cerium, lanthanum, praseodymium, neodymium, promethium, samarium, europium, gadolinium, terbium, dysprosium, holmium, erbium, thulium, ytterbium, and lutetium), alkali metals (e.g., lithium, sodium, potassium, rubidium, and cesium), and alkali earth metals (e.g., beryllium, magnesium, calcium, strontium, and barium). In an example embodiment, such salt in the solid state electrolyte 106 may contain a lithium and/or sodium ions. In some embodiments, the solid state electrolyte 106 may initially contain a solvent, such as butanol, which may be evaporated off once the electrochromic device is assembled. In some embodiments, the solid state electrolyte 106 may be around 40-60 wt % plasticizer material, preferably around 50-55 wt % plasticizer material. In an embodiment, the plasticizer material may include at least one of tetraglyme and an alkyl hydroperoxide. In an embodiment, the polymer material of the solid state electrolyte 106 may be polyvinylbutyral (PVB), and the salt may be lithium bis(trifluoromethane). In other embodiments, the solid state electrolyte 106 may include at least one of lithium phosphorus oxynitride (LiPON) and tantalum pentoxide ($Ta_2O_5$).

In some embodiments, the electrolyte 106 may include a sacrificial redox agent (SRA). Suitable classes of SRAs may include, but are not limited to, alcohols, nitrogen heterocycles, alkenes, and functionalized hydrobenzenes. Specific examples of suitable SRAs may include benzyl alcohol, 4-methylbenzyl alcohol, 4-methoxybenzyl alcohol, dimethylbenzyl alcohol (3,5-dimethylbenzyl alcohol, 2,4-dimethylbenzyl alcohol etc.), other substituted benzyl alcohols, indoline, 1,2,3,4-tetrahydrocarbazole, N,N-dimethylaniline, 2,5-dihydroanisole, etc. In various embodiments, the SRA molecules may create an air stable layer that does not require an inert environment to maintain charge.

Polymers that may be part of the electrolyte 106 may include, but are not limited to, poly(methyl methacrylate) (PMMA), poly(vinyl butyral-co-vinyl alcohol-co-vinyl acetate) (PVB), poly(ethylene oxide) (PEO), fluorinated co-polymers such as poly(vinylidene fluoride-co-hexafluoropropylene), poly(acrylonitrile) (PAN), poly(vinyl alcohol) (PVA), etc. Plasticizers that may be part of the polymer electrolyte formulation include, but are not limited to, glymes (tetraglyme, triglyme, diglyme etc.), propylene carbonate, ethylene carbonate, ionic liquids (1-ethyl-3-methylimidazolium tetrafluoroborate, 1-butyl-3-methylimidazolium hexafluorophosphate, 1-butyl-3-methylimidazolium bis(trifluoromethane sulfonyl) imide, 1-butyl-1-methyl-pyrrolidinium bis(trifluoromethane sulfonyl)imide, etc.), N,N-dimethylacetamide, and mixtures thereof.

In some embodiments, the electrolyte 106 may include, by weight, 10-30% polymer, 40-80% plasticizer, 5-25% lithium salt, and 0.5-10% SRA.

The counter electrode 108 of the various embodiments should be capable of storing enough charge to sufficiently balance the charge needed to cause visible tinting to the nanostructured transition metal oxide bronze in the working electrode 104. In various embodiments, the counter electrode 108 may be formed as a conventional, single component film, a nanostructured film, or a nanocomposite layer.

In some embodiments, the counter electrode 108 may be formed from at least one passive material that is optically transparent to both visible and NIR radiation during the applied biases. Examples of such passive counter electrode materials may include $CeO_2$, $CeVO_2$, $TiO_2$, indium tin oxide, indium oxide, tin oxide, manganese or antimony doped tin oxide, aluminum doped zinc oxide, zinc oxide, gallium zinc oxide, indium gallium zinc oxide, molybdenum doped indium oxide, $Fe_2O_3$, and/or $V_2O_5$. In other embodiments the counter electrode 108 may be formed from at least one complementary material, which may be transparent to NIR radiation but which may be oxidized in response to application of a bias, thereby causing absorption of visible light radiation. Examples of such complementary counter electrode materials may include $Cr_2O_3$, $MnO_2$, $FeO_2$, $CoO_2$, $NiO_2$, $RhO_2$, or $IrO_2$. The counter electrode materials may include a mixture of one or more passive materials and/or one or more complementary materials described above.

Without being bound to any particular theory, it is believed that the application of a first voltage in the various embodiments may cause the interstitial dopant species (e.g., cesium) in the crystal structure of the transition metal oxide bronze to have a greater amount of free carrier electrons and/or to cause the interstitial dopant species (e.g., lithium ions from the electrolyte) to perform non-faradaic capacitive or pseudo-capacitive charge transfer on the surface of the nanostructures 112, which may cause the surface plasmon resonance effect to increase the absorption of NIR radiation. In this manner, the absorption properties of the transition metal oxide bronze characteristics may change (i.e., increased absorption of NIR radiation) upon application of the first voltage. Further, application of a second voltage having a higher absolute value than the first voltage in the various embodiments may cause faradaic intercalation of an intercalation dopant species (e.g., lithium ions) from the electrolyte into the transition metal oxide nanostructures. It is believed that the interaction of this dopant species provides interstitial dopant atoms in the lattice which creates a polaron effect. In this manner, the lattice structure of transition metal oxide nanoparticles may experience a polaron-type shift, thereby altering its absorption characteristics (i.e., shift to visible radiation) to block both visible and near infrared radiation.

In some embodiments, in response to radiation of certain spectral regions, such as UV (e.g., at wavelengths of around 10-400 nm) may cause excitons to be generated in the polymer material of the solid state electrolyte 106. The UV radiation may also excite electrons in the doped transition metal oxide bronze to move into the conduction band, leaving holes in the valence band. The generated excitons in the polymer material may dissociate to free carriers, the electrons of which may be attracted to the holes in the valence band in the doped transition metal oxide bronze (e.g., cesium-doped tungsten trioxide ($Cs_xWO_3$)) of nanoparticles 112. Since electrochemical reduction of various transition metal oxide bronzes by such free electron charge carriers may degrade their performance (i.e., from unwanted coloration of the transition metal oxide bronze), embodiment devices may include one or more layer of a protective material to prevent UV radiation from reaching the solid state electrolyte 106, in addition to or instead of nanostructures 113 mixed into the working electrode.

FIG. 1B illustrates an embodiment electrochromic device 150 that addresses degradation of the doped transition metal oxide bronze nanostructures 112. Similar to device 100 shown in FIG. 1A, device 150 may include a first transparent conductor layer 102a, a working electrode 104, a solid state electrolyte 106, a counter electrode 108, a second transparent conductor layer 102b, and one or more optically transparent support layers 110a, 110b. In addition, device 150 may include one or more protective layers 116a, 116b made of a material that absorbs UV radiation. In an example embodiment, the device 150 may include a first protective layer 116a disposed between a first support layer 110a and the first transparent conductor layer 102a. The device may optionally include a second protective layer 116b disposed between a second support layer 110b and the second transparent conductor layer 102b. Alternatively, the UV protective layer 116a may be disposed on the exterior surface of the first support layer 110a, or may be disposed between the first transparent conductor 102a and the working electrode 104. In other words, the first and/or second UV protective layers 116a, 116b may be disposed between any of the layers of the electrochromic device 150, such that UV radiation is substantially prevented from reaching the working electrode 104.

The UV radiation absorbing material of the one or more protective layers 116a, 116b of the various embodiments may be any of a number of barrier films. For example, the one or more protective layers 116a, 116b may be a thin film of at least one TCO material, which may include a same as or different from TCO compositions in the nanostructures 113. In an example embodiment, a protective layer 116a of the device 150 may be an ITO thin film, and therefore capable of absorbing UV radiation by band-to-band absorption (i.e., absorption of a UV photon providing enough energy to excite an electron from the valence band to the conduction band). In another example embodiment, the device may include the TCO nanostructures 113 made of ITO, as well as a protective layer 116a composed of an ITO thin film. Alternatively, the TCO nanostructures 113 may form a separate thin film layer 116b disposed between the transition metal oxide bronze nanoparticles 112 and the transparent conductor 102a. In some embodiments, the UV radiation absorbing materials of protective layers 116a, 116b may include organic or inorganic laminates.

In another embodiment, at least one UV protective layer, such as protective layer 116a in FIG. 1B, may be a UV radiation reflector made of a high index transparent metal oxide. Since birds can see radiation in the UV range, a UV reflector may be implemented in embodiments positioned as outside windows in order to prevent birds from hitting the windows. In some other embodiments, UV radiation absorbing organic molecules and/or inorganic UV radiation absorbing nanoparticles (e.g., zinc oxide, indium oxide, ITO, etc.) may be incorporated within the electrolyte 106 material.

FIG. 1C illustrates another embodiment electrochromic device 170 that addresses degradation of the doped transition metal oxide bronze nanostructures 112 by controlling the effects of the electron charge carriers generated in the electrolyte from exposure to UV radiation. Similar to devices 100 and 150 discussed above with respect to FIGS. 1A and 1B respectively, device 170 may include a first transparent conductor layer 102a, a working electrode 104, a solid state electrolyte 106, a counter electrode 108, a second transparent conductor layer 102b, and one or more optically transparent support layers 110a, 110b. In addition, device 170 may include a protective layer 118 positioned between the working electrode 104 and the electrolyte 106. The protective layer 118 may be composed of one or more ionically conductive and electrically insulating material.

As discussed above, without being bound to any particular theory, it is believed that the migration of intercalation ions between the electrolyte 106 and the working electrode 104 is responsible for at least some of the device's capability to modulate spectral absorption. Therefore, in order to maintain operability of the device, the electrically insulating material used to form the protective layer 118 should also be ionically conductive. That is, the material of the protective layer 118 may prevent or reduce free electrons in the solid state electrolyte layer 106 from reducing the transition oxide bronze of nanoparticles 112, while allowing the diffusion of ions of an intercalation dopant species (e.g., Na, Li, etc.) between the electrolyte 106 and working electrode 104. In an example embodiment, the electrically insulating material that makes up the protective layer 118 may be tantalum oxide, such as tantalum pentoxide ($Ta_2O_5$), which blocks migration of electrons from the electrolyte 106 while allowing diffusion of the intercalation dopant species ions (e.g., lithium ions) from the electrolyte 106. In this manner, degradation of the transition metal oxide bronze is reduced or prevented by controlling the effect of the absorbed UV radiation in addition to or instead of instead of blocking its absorption. Other example materials that may be used to form the protective layer 118 in addition to or instead of tantalum pentoxide may include, without limitation, strontium titanate ($SrTiO_3$), zirconium dioxide ($ZrO_2$), indium oxide, zinc oxide, tantalum carbide, niobium oxide, and various other dielectric ceramics having similar electrical and/or crystalline properties to tantalum pentoxide.

In an alternative embodiment, instead of or in addition to the protective layer 118, the nanostructures 112 may each be encapsulated in a shell containing an electrically insulating and ionically conductive material, which may be the same as or different from the material of the protective layer 118 (e.g., tantalum oxide, strontium titanate, zinc oxide, indium oxide, zirconium oxide, tantalum carbide, or niobium oxide).

In an example embodiment, each nanostructure 112 may have a core of cubic or hexagonal unit cell lattice structure tungsten bronze, surrounded by a shell of tantalum pentoxide.

In some embodiments, the electrolyte 106 may include a polymer that reduces damage to the device due to UV radiation. The polymer may be any of a number of polymers that are stable upon absorption of UV radiation (e.g., no creation of proton/electron pairs). Examples of such polymers may include, but are not limited to, fluorinated polymers without hydroxyl (—OH) groups (e.g., polyvinylidene difluoride (PVDF)).

In another embodiment, a positive bias may be applied to the counter electrode 108 to draw UV radiation generated electrons from the electrolyte 106 to the counter electrode 108 in order to reduce or prevent electrons from the electrolyte 106 from moving to the working electrode 104 to avoid the free electron-caused coloration of the doped transition metal oxide bronze in the working electrode 104.

In another embodiment, a device may include more than one of, such as any two of, any three of, or all four of: (i) a protective layer of electrically insulating material (e.g., protective layer 118 or protective material shells around the bronze nanoparticles), (ii) one or more protective layer of UV radiation absorbing material (e.g., protective layer(s) 116a and/or 116b in FIG. 1B and/or UV radiation absorbing organic molecules and/or inorganic UV radiation absorbing nanoparticles incorporated within the electrolyte 106 material), (iii) electrolyte polymer that is stable upon absorption of UV radiation, and/or (iv) application of positive bias to the counter electrode 108. In various embodiments, the nanostructures 113 may be included in or omitted from electrochromic devices 150, 170.

In another embodiment, the protective layer(s) 116a and/or 116b may comprise a stack of metal oxide layers. Alternatively, the stack may comprise a separate component that is provided instead of or in addition to the layer(s) 116a and/or 116b. The stack may provide improvement in the reflected color of the electrochromic device. Prior art devices generally have a reddish/purplish color when viewed in reflection. The stack may comprise index-matched layers between the glass and transparent conductive oxide layer to avoid the reddish/purplish reflected color. As noted above, the index-matched layer can serve as the UV absorber or be used in addition to another UV absorber. The stack may comprise a zinc oxide based layer (e.g., ZnO or AZO) beneath an indium oxide based layer (e.g., indium oxide or ITO).

Compared to nanocomposite electrochromic films, the various embodiments may involve similar production by utilizing a single nanostructured material in the working electrode to achieve the desired spectral absorption control in both NIR and visible regions, and another nanostructured material to enhance and expand such control in the NIR region. Further, the various embodiments may provide one or more additional layer(s) of a protective material to minimize degradation of the single nanostructured material.

In some embodiments, the working electrode and/or the counter electrode may additionally include at least one material, such as an amorphous nano structured material, that enhances spectral absorption in the lower wavelength range of the visible region. In some embodiments, the at least one amorphous nanostructured material may be at least one nanostructured amorphous transition metal oxide.

In particular, the amorphous nano structured materials may provide color balancing to the visible light absorption that may occur due to the polaron-type shift in the spectral absorption of the doped-transition metal oxide bronze. As discussed above, upon application of the second voltage having a higher absolute value, the transition metal oxide bronze may block (i.e., absorb) radiation in the visible range. In various embodiments, the absorbed visible radiation may have wavelengths in the upper visible wavelength range (e.g., 500-700 nm), which may cause the darkened layer to appear blue/violet corresponding to the un-absorbed lower visible wavelength range (e.g., around 400-500 nm). In various embodiments, upon application of the second voltage, the at least one nanostructured amorphous transition metal oxide may absorb complementary visible radiation in the lower visible wavelength range (e.g., 400-500 nm), thereby providing a more even and complete darkening across the visible spectrum with application of the second voltage. That is, use of the amorphous nanostructured material may cause the darkened layer to appear black.

In some embodiments, at least one nanostructured amorphous transition metal oxide may be included in the working electrode 104 in addition to the doped-transition metal oxide bronze nanostructures 112 and the optional TCO nanostructures 113. An example of such material in the working electrode 104 may be, but is not limited to, nanostructured amorphous niobium oxide, such as niobium(II) monoxide (NbO) or other niobium oxide materials (e.g., $NbO_x$). In some embodiments, the counter electrode 108 may include, as a complementary material, at least one nanostructured amorphous transition metal oxide. That is, in addition to optically passive materials, the counter electrode 108 may include at least one material for color balancing (i.e., complementing) the visible radiation absorbed in the working electrode (i.e., by the transition metal oxide bronze. An example of such material in the counter electrode 108 may be, but is not limited to, nanostructured amorphous nickel oxide, such as nickel(II) oxide (NiO) or other nickel oxide materials (e.g., $NiO_x$).

In the various embodiments, nanostructures that form the working and/or counter electrode, including the at least one amorphous nanostructured material, may be mixed together in a single layer. An example of a mixed layer is shown in FIG. 1A with respect to transition metal oxide bronze nanostructures 112 and TCO nanostructures 113. Alternatively, nano structures that form the working and/or counter electrode, including the at least one amorphous nanostructured material, may be separately layered according to composition. For example, a working electrode may include a layer of amorphous $NbO_x$ nanostructures, a layer of transition metal oxide bronze nanostructures, and a layer of ITO nanostructures, in any of a number of orders.

The nanostructured transition metal oxide bronzes that may be part of the working electrode 104 in various embodiment devices can be formed using any of a number of low cost solution process methodologies. For example, solutions of $Nb:TiO_2$ and $Cs_xWO_3$ may be synthesized using colloidal techniques. Compared to other synthetic methodologies, colloidal synthesis may offer a large amount of control over the nanostructure size, shape, and composition of the nanostructured transition metal oxide bronze. After deposition, a nanostructured transition metal oxide bronze material in the working electrode 104 may be subjected to a thermal post treatment in air to remove and cap ligands on the surface of the nanostructures.

In various embodiments, nanostructured amorphous transition metal oxide materials may be formed at room temperature from an emulsion and an ethoxide precursor. For example, procedures used to synthesize tantalum oxide nanoparticles that are described in "Large-scale synthesis of bioinert tantalum oxide nanoparticles for X-ray computed tomography imaging and bimodal image-guided sentinel lymph node mapping" by M H Oh et al. (J Am Chem Soc. 2011 Apr. 13; 133(14):5508-15), incorporated by reference herein, may be similarly used to synthesize amorphous transition metal oxide nanoparticles. For example, an overall synthetic process of creating the nanoparticle, as described in Oh et al., may adopted from the microemulsion synthesis of silica nanoparticles. In such process, a mixture of cyclohexane, ethanol, surfactant, and a catalysis for the sol-gel reaction may be emulsified. The ethoxide precursor may be added to the emulsion, and uniform nanoparticles may be formed by a controlled-sol gel reaction in the reverse micelles at room temperature within around 5 minutes. The sol-gel reaction may be catalyzed, for example, by NaOH.

In some embodiments, the nanostructured amorphous transition metal oxide may be sintered at a temperature of at least 400° C. for at least 30 minutes, such as 400 to 600° C. for 30 to 120 minutes to form a porous web. In an example embodiment, the porous web may be included in a working electrode 104, with the tungsten bronze nanoparticles and ITO nanoparticles incorporated in/on the web. Alternatively, the sintering step may be omitted and the nano structured amorphous transition metal oxide may remain in the device in the form of nanoparticles having amorphous structure. In this embodiment, the device containing the nanostructured amorphous transition metal oxide may include or may omit the protective layer(s) 116a, 116b, and 118, the UV stable electrolyte polymer, and the application of positive bias to the counter electrode.

Electrochromic responses of prepared nano structured transition metal oxide bronze materials (e.g., $Cs_xWO_3$, $Nb:TiO_2$, etc.) may be demonstrated by spectro-electrochemical measurements.

In various embodiments, the shape, size, and doping levels of nanostructured transition metal oxide bronzes may be tuned to further contribute to the spectral response by the device. For instance, the use of rod versus spherical nanostructures 112 may provide a wider level of porosity, which may enhance the switching kinetics. Further, a different range of dynamic plasmonic control may occur for nanostructures with multiple facets, such as at least 20 facets.

Various embodiments may also involve alternation of the nanostructures 112 that form the working electrode 104. For example, the nanostructures may be nanoparticles of various shapes, sizes and/or other characteristics that may influence the absorption of NIR and/or visible light radiation. In some embodiments, the nanostructures 112 may be isohedrons that have multiple facets, preferably at least 20 facets.

In some embodiments, the transition metal oxide bronze nanostructures 112 may be a combination of nanoparticles having a cubic unit cell crystal lattice ("cubic nanoparticles") and nanoparticles having a hexagonal unit cell crystal lattice ("hexagonal nanoparticles"). Each unit cell type nanoparticle contributes to the performance of the working electrode 104. For example, the working electrode 104 may include both cubic and hexagonal cesium doped tungsten oxide bronze nanoparticles. In alternative embodiments, the working electrode 104 may include either cubic or hexagonal cesium doped tungsten oxide nanoparticles. For example, the working electrode 104 may include cubic cesium-doped tungsten oxide (e.g. $Cs_1W_2O_{6-x}$) nanoparticles and amorphous niobium oxide nanoparticles or hexagonal cesium-doped tungsten oxide (e.g. $Cs_{0.29}W_1O_3$) nanoparticles without niobium oxide. In alternative embodiments, the working electrode 104 may include undoped tungsten oxide (e.g. $WO_{3-x}$) nanoparticles where $0 \leq x \leq 0.33$, such as $0 < x \leq 0.17$, including $0 < x \leq 0.1$.

For example, upon application of the first (i.e., lower absolute value) voltage described above, the hexagonal bronze nanostructures 112 may block NIR radiation having wavelengths in the range of around 800-1700 nm, with the peak absorption at the mid-NIR wavelength of around 1100 nm. The cubic bronze nanostructures 112 may block NIR radiation having wavelengths in the close-NIR range with the peak absorption of around 890 nm. The indium oxide based (including ITO) and/or zinc oxide based (including AZO) nanostructures 113 may be included in the working electrode 104 to block the higher wavelength IR radiation upon application of the first voltage. Thus, the cubic bronze and hexagonal bronze nanostructures may block respective close and mid-NIR radiation (e.g., using the Plasmon effect), while the nanostructures 113 may block the higher wavelength IR radiation.

Upon application of the second (i.e., higher absolute value) voltage described above, the cubic bronze nanostructures 112 may block visible and NIR radiation having wavelengths in the range of around 500-1500 nm, with the peak absorption at the close-NIR wavelength of around 890 nm (e.g., using the polaron effect). Optionally, the amorphous niobium oxide may also be added to the working electrode 104 to block the short wavelength visible radiation (e.g., 400 to 500 nm wavelength).

The cubic bronze nanostructures block visible radiation via the polaron effect at a lower applied voltage than the hexagonal bronze nanostructures. Thus, the second voltage may have an absolute value which is below the value at which the hexagonal bronze nano structures block visible radiation via the polaron effect such that these nanostructures do not contribute to blocking of visible radiation. Alternatively, the second voltage may have an absolute value which is above the value at which the hexagonal bronze nanostructures block visible radiation via the polaron effect such that these nanostructures also contribute to blocking of visible radiation.

Embodiment nanoparticles that form the working electrode 104 may be around 4-6 nm in diameter, and may include 40 to 70 wt %, such as around 50 wt % cubic tungsten bronze nanostructures, 15 to 35 wt %, such as around 25 wt % hexagonal tungsten bronze nanostructures, and optionally 15 to 35 wt %, such as around 25 wt % ITO nanostructures. In some embodiments, in order to achieve color balancing as described above, the nanoparticles that form the working electrode 104 may optionally include around 5-10 wt % amorphous $NbO_x$ nanostructures in place of cubic tungsten bronze nanostructures. In this embodiment, the device containing two types of bronze nanoparticles may include or may omit the protective layer(s) 116a, 116b, and 118, the UV stable electrolyte polymer, the application of positive bias to the counter electrode, and the amorphous niobium oxide.

In summary, the working electrode 104 may include one or more of the following components:
(a) metal oxide bronze nanostructures 112 having (i) a cubic, (ii) hexagonal, or (iii) a combination of cubic and hexagonal unit cell lattice structure;
(b) protective (i) indium oxide based (including ITO) and/or zinc oxide based (including AZO) nanostructures 113;
(c) amorphous niobium oxide nanoparticles and/or web; and/or
(d) additional nanostructures selected from undoped tungsten oxide, molybdenum oxide, titanium oxide, and/or vanadium oxide.

The counter electrode 108 may include one or more of the following components:
(a) passive electrode material selected from cerium(IV) oxide ($CeO_2$), titanium dioxide ($TiO_2$), cerium(III) vanadate ($CeVO_2$), indium(III) oxide ($In_2O_3$), tin-doped indium oxide, tin(II) oxide ($SnO_2$), manganese-doped tin oxide, antimony-doped tin oxide, zinc oxide (ZnO), aluminum-doped zinc oxide (AZO), iron(III) oxide ($Fe_2O_3$), and vanadium(V) oxide ($V_2O_5$);
(b) an active electrode material selected from chromium (III) oxide ($Cr_2O_3$), manganese dioxide ($MnO_2$), iron (II) oxide (FeO), cobalt oxide (CoO), nickel(II) oxide (NiO), rhodium(IV) oxide ($RhO_2$), and iridium(IV) oxide ($IrO_2$);
(c) amorphous nickel oxide nanoparticles and/or web; and/or
(d) conductivity enhancer nanoparticles selected from indium oxide, ITO, and zinc oxide.

While the various embodiments are described with respect to electrochromic windows, the embodiment methods, systems, and devices may also be used in materials for other types of smart windows. Such smart windows may include, but are not limited to, polymer-dispersed liquid crystals (PLDD), liquid crystal displays (LCDs), thermochromics, etc.

Color Tunability

Color tunability of electrochromic devices is applicable to a variety of applications. According to various embodiments, the present disclosure provides electrochromic devices having the capability of achieving a multitude of colors that may not currently be available in the market. The technique for achieving color tunability in one embodiment is based on the selection of the composition and the deposition of the active materials. While colored glass may be achieved by the use of doped glass (e.g., glass with metal impurities added to impart color), this is a non-standard product from most primary glass manufacturers on their float lines, and this entails cost premium. By contrast, the presently disclosed color tunability can be achieved in a nearly cost-neutral fashion, as the nanostructures can be synthesized for approximately the same cost for devices of different colors.

According to various embodiments, the present disclosure allows color of electrochromic devices to be tuned by utilizing various nanostructure compositions, or mixtures thereof, in the active, i.e. working, electrode of an electrochromic device. In particular, depending on the nanostructure components used and/or a ratio therebetween, a wide range of colors may be achieved, such as, for example, gray, blue, green, purple, and brown, but the present disclosure is not limited thereto. For example, an electrochromic device may include a working electrode including a variety of metal oxide nanostructures, such as nanocrystals and amorphous metal oxide nanoparticles. Such nanostructures may include $WO_3$, $Cs_xWO_3$ (where $0.2 \leq x \leq 0.4$, e.g., $0.29 \leq x \leq 0.31$), $Cs_1WO_{6-\sigma}$ (where $0 \leq \sigma \leq 0.3$), $NbO_x$, $TiO_2$, $MoO_3$, $NiO_2$, $V_2O_5$, or combinations thereof.

Figure 2:
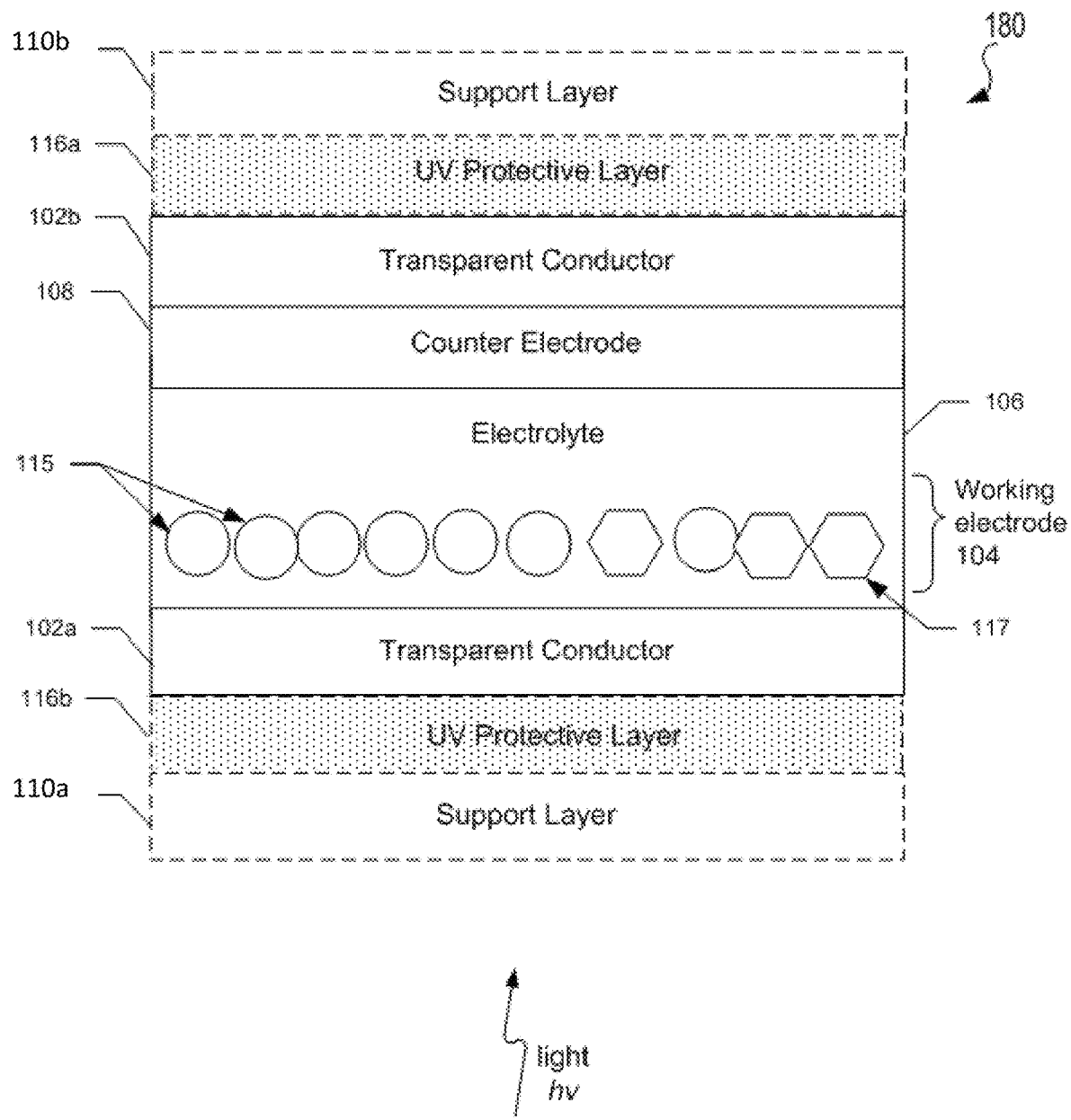
FIG. 2 is a schematic representation of an electrochromic device that may be tuned to produce a particular color, according to various embodiments or the present disclosure.

FIG. 2 is a schematic representation of an electrochromic device 180 that may be configured to produce a particular color, according to various embodiments or the present disclosure. The electrochromic device 180 is similar to the electrochromic device 150 of FIG. 1B, so only the differences therebetween will be discussed in detail.

Referring to FIG. 2, the electrochromic device 180 includes a working electrode 104. In particular, the working electrode 104 may include various nanostructures as discussed above, in order to produce corresponding colors. For example, the working electrode may include first nanostructures 115 and/or second nanostructures 117, according to a particular color the working electrode 104 is configured to form. In other words, the second nanostructures 117 may be omitted, or additional nanostructures may be added.

For example, in order to produce a blue color, the working electrode 104 may include about 100 wt. % of $WO_3$ as the first nanostructures 115 and may omit the second nanostructures 117. In order to produce a green color, the working electrode 104 may include about 60 wt. % of $Cs_xWO_3$, such as $Cs_{.29}WO_3$, hexagonal crystal lattice structure nanocrystals as the first nanostructures 115, and about 40 wt. % of indium tin oxide (e.g., $Sn:In_2O_3$) nanocrystals as the second nanostructures 117.

In order to produce a brown color, the working electrode 104 may include about 100 wt. % $NbO_x$ nanoparticles (e.g., $Nb_2O_{5-\sigma}$ where $0 \leq \sigma \leq 0.1$) as the first nanostructures 115 and may omit the second nanostructures 117. In order to produce a purple color, the working electrode 104 may include about 100 wt. % $Nb:TiO_2$ nanocrystals as the first nanostructures 115 and may omit the second nanostructures 117.

According to various embodiments, the present inventors discovered that electrochromic devices that produce a neutral gray color may be unexpectedly advantageous. In particular, since the human eye is less sensitive with respect to detecting variations in neutral gray colors, as compared to variations in other colors, color variations in adjacent electrochromic devices that produce neutral gray colors are less noticeable to the human eye. As such, tone variations between adjacent electrochromic devices producing a neutral gray color may be greater than for other colors, without being noticeable to the human eye.

For example, in order to produce a neutral gray color, the first nanostructures 115 may include amorphous niobium oxide ("$NbO_x$") nanoparticles (e.g., $Nb_2O_{5-\sigma}$ where $0 \leq \sigma \leq 0.1$), and the second nanostructures 117 may include cesium doped tungsten oxide ("CWO") nanoparticles having a cubic crystal lattice structure (e.g., $CsW_2O_{6-\sigma}$ nanocrystals, where $0 \leq \sigma \leq 0.3$). Herein, the CWO nanoparticles may be referred to as "nanocrystals", due to their crystalline structure. The relative amounts of the $NbO_x$ nanoparticles and CWO nanocrystals included in the working electrode 104 may result in variations in the color of the working electrode 104.

In particular, the working electrode 104 may include a nanostructured layer comprising from about 40 to about 80 wt. % of the $NbO_x$ nanoparticles and from about 60 to about 10 wt. % of the CWO nanocrystals. In other embodiments, the working electrode 104 may include from about 65 to about 80 wt. % of the $NbO_x$ nanoparticles and from about 35 to about 20 wt. % of the CWO nanocrystals. In some embodiments, the working electrode may include from about 40 to 50 wt. % of the $NbO_x$ nanoparticles and from about 60 to about 50 wt. % of the CWO nanocrystals.

According to various embodiments, the $NbO_x$ nanoparticles may have an average particle size of from about 2 to about 6 nm, such as from about 3 to about 5 nm. For example, the $NbO_x$ nanoparticles may have an average particle size of about 4 nm. The CWO nanocrystals may have an average particle size of from about 3 to about 7 nm, such as from about 4 to about 6 nm. For example, the CWO nanocrystals may have an average particle size of about 5 nm.

According to other embodiments, the working electrode 104 may include a nanostructured layer comprising a mixture of amorphous molybdenum oxide nanoparticles ("$MoO_3$") and tungsten oxide nanocrystals ("$WO_3$"), in order to produce a neutral gray color. In particular, the working electrode 104 may include a nanostructured layer comprising from about 40 to about 80 wt. % of the $MoO_3$ nanoparticles and from about 60 to about 10 wt. % of the $WO_3$ nanocrystals. In other embodiments, the working electrode 104 may include from about 65 to about 80 wt. % of the $MoO_3$ nanoparticles and from about 35 to about 20 wt. % of the $WO_3$ nanocrystals. In some embodiments, the working electrode may include from about 40 to 50 wt. % of the $MoO_3$ nanoparticles and from about 60 to about 50 wt. % of the $WO_3$ nanocrystals.

According to some embodiments, the working electrode 104 may include a nanostructured layer comprising molybdenum doped tungsten oxide nanocrystals. For example, the molybdenum doped tungsten oxide nanocrystals may be represented by the general formula $Mo_xWO_3$ (where $0.1 \leq x \leq 0.75$, e.g., $0.2 \leq x \leq 0.5$).

According to various embodiments, the working electrode 104 may include a nanostructured layer comprising a mixture of amorphous niobium oxide (e.g., $NbO_x$ described above) nanoparticles and undoped tungsten oxide nanocrystals, in order to produce a neutral gray color. In some embodiments, when the tungsten oxide is initially manufactured, the tungsten oxide may be dark blue in color. This may indicate oxygen vacancies in the tungsten oxide, meaning that the tungsten oxide is oxygen deficient (i.e., non-stoichiometric). The tungsten oxide may be annealed in air after initial manufacturing (e.g., before or after being placed into the electrochromic device), which may result in the tungsten oxide becoming transparent. The air-annealing may result in the filling of oxygen deficiencies in the tungsten oxide nanocrystals, which may result in the tungsten oxide being stoichiometric or less non-stoichiometric.

For example, the tungsten oxide may be represented by $WO_{3-x}$, where $0 \leq x \leq 0.33$, such as $0 \leq x \leq 0.17$. The tungsten oxide may be oxygen deficient, such that $0 < x \leq 0.33$, such as $0 < x \leq 0.17$. The tungsten oxide (e.g., undoped tungsten oxide) may have a cubic crystal structure. In particular, the working electrode 104 may include from about 85 to about 95 wt. % $NbO_x$ nanoparticles and from about 15 to about 5 wt. % $WO_{3-x}$ nanocrystals. In other embodiments, the working electrode 104 may include from about 88 to about 93 wt. % $NbO_x$ nanoparticles and from about 13 to about 7 wt. % $WO_{3-x}$ nanocrystals. In other embodiments, the working electrode 104 may include about 90 wt. % $NbO_x$ nanoparticles and about 10 wt. % $WO_{3-x}$ nanocrystals.

In some embodiments, the working electrode 104 may have a thickness ranging from about 1200 to about 1800 nm. For example, the working electrode 104 may have a thickness ranging from about 1300 to about 1700 nm, or a thickness ranging from about 1400 to about 1600 nm. In other embodiments, the working electrode 104 may have a thickness of about 1500 nm and may include about 90 wt. % $NbO_x$ nanoparticles and about 10 wt. % oxygen deficient $WO_3$, nanocrystals.

In various embodiments, the working electrode 104 comprises from about 40 to about 95 wt. % of amorphous niobium oxide nanoparticles and from about 60 to about 5 wt. % of cesium doped tungsten oxide nanoparticles having a cubic crystal lattice structure, or undoped, oxygen deficient tungsten oxide, based on the total weight of the nanostructures.

Monolithic Manufacturing

Conventionally, EC devices have been manufactured using a two substrate process. For example, a working electrode and a transparent conductor are formed on a first glass substrate, and a counter electrode and a transparent conductor are formed on a second glass substrate. A separate assembly process is applied to join the substrates and introduce an electrolyte therebetween. In particular, such a separate assembly process is required, since electrodes cannot be formed directly on a conventional polymer electrolyte. Accordingly, such a multistage process increases manufacturing costs, as compared to a monolithic process, where all layers of the EC device are deposited over a single substrate.

Figure 3:
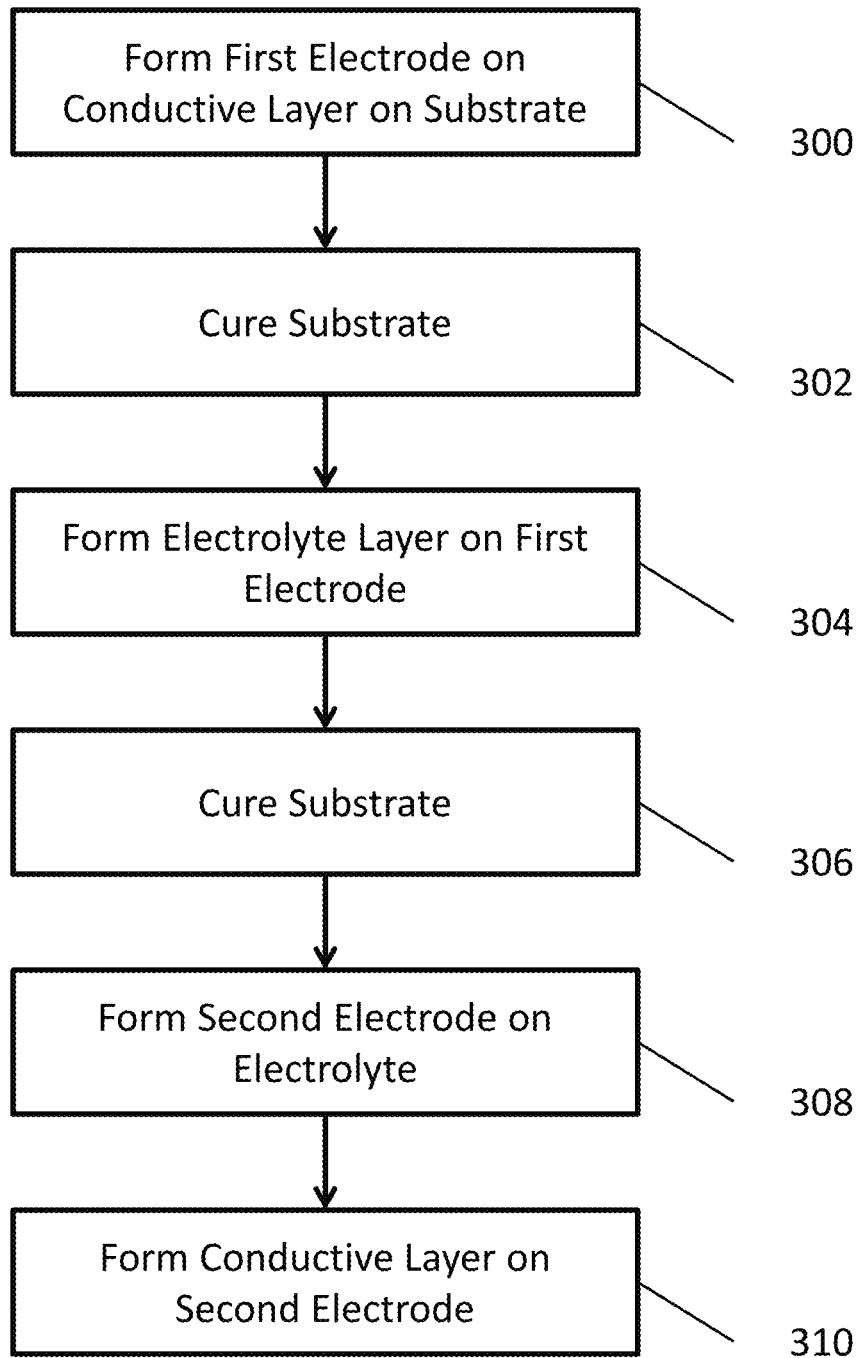
FIG. 3 is a flow diagram illustrating a method of manufacturing an EC pane unit, according to various embodiments of the present disclosure.

FIG. 3 is a flow diagram of a monolithic manufacturing process for forming an EC pane unit that includes an EC device disposed on a single substrate, according to various embodiments of the present disclosure. Referring to FIG. 3, in step 300, the method includes forming a first electrode on a transparent substrate, such as a glass or plastic substrate (e.g., a window pane). Herein, "transparent" refers to an element that transmits substantially all of visible radiation (e.g., visible light) incident thereto, such as at least about 90%, at least about 95%, or at least about 98% of the visible radiation incident thereto.

The first electrode may be formed on a transparent, electrically conductive layer already disposed on the substrate. In some embodiments, the conductive layer may be formed of a transparent conductive oxide (TCO). For example, the conductive layer may be a fluorine-doped tin oxide layer formed by a pyrolytic process, or an ITO layer formed by a sputtering process.

The first electrode may be formed by a solution deposition process and may have a nano-crystalline structure. The first electrode may operate as a working electrode or a counter electrode in a completed EC device.

In step 302, the substrate may be cured. For example, the substrate may be heated to drive of any remaining solvents from the solution deposition of step 300, and/or to improve the crystal structure of the first electrode.

In step 304, an electrolyte layer may be formed on the first electrode. For example, the electrolyte layer may be formed by a depositing a tantalum oxide layer using a sol-gel deposition process. However, the electrolyte layer may be formed of any suitable material having a high lithium ion conductivity. Preferably, the electrolyte comprises an inorganic lithium ion conductive layer rather than a polymer electrolyte.

In step 306, the substrate may be cured. For example, the substrate may be heated to drive of any remaining solvents from the sol-gel deposition of step 304 and/or to improve the crystal structure of the electrolyte layer.

In step 308, a second electrode may be formed on the electrolyte layer. The second electrode may be formed by depositing a nano-crystalline layer by a solution deposition, as described in step 300. The first and second electrodes may be different ones of a working electrode and a counter electrode described in the prior embodiments.

In step 310, a transparent, electrically conductive layer may be formed on the second electrode by a vapor deposition process. For example, the conductive layer may be formed by a physical vapor deposition (PVD) process, such as arc evaporation, sputtering, ion plating, enhanced sputtering, or by a chemical vapor deposition (CVD) process, such as, atmospheric pressure chemical vapor deposition (APCVD), or the like. However, any other suitable deposition process may be used.

In some embodiments, one or both of the curing steps may be omitted. For example, if sufficiently volatile solvents are used in preceding steps of the method, the corresponding curing steps may be omitted or conducted in a single step after all layers are deposited. In other embodiments, the method may further include assembling the EC pane unit into an EC window, by attaching the EC pane unit to another substrate, using a sealing separator, as discussed below.

Figure 4:
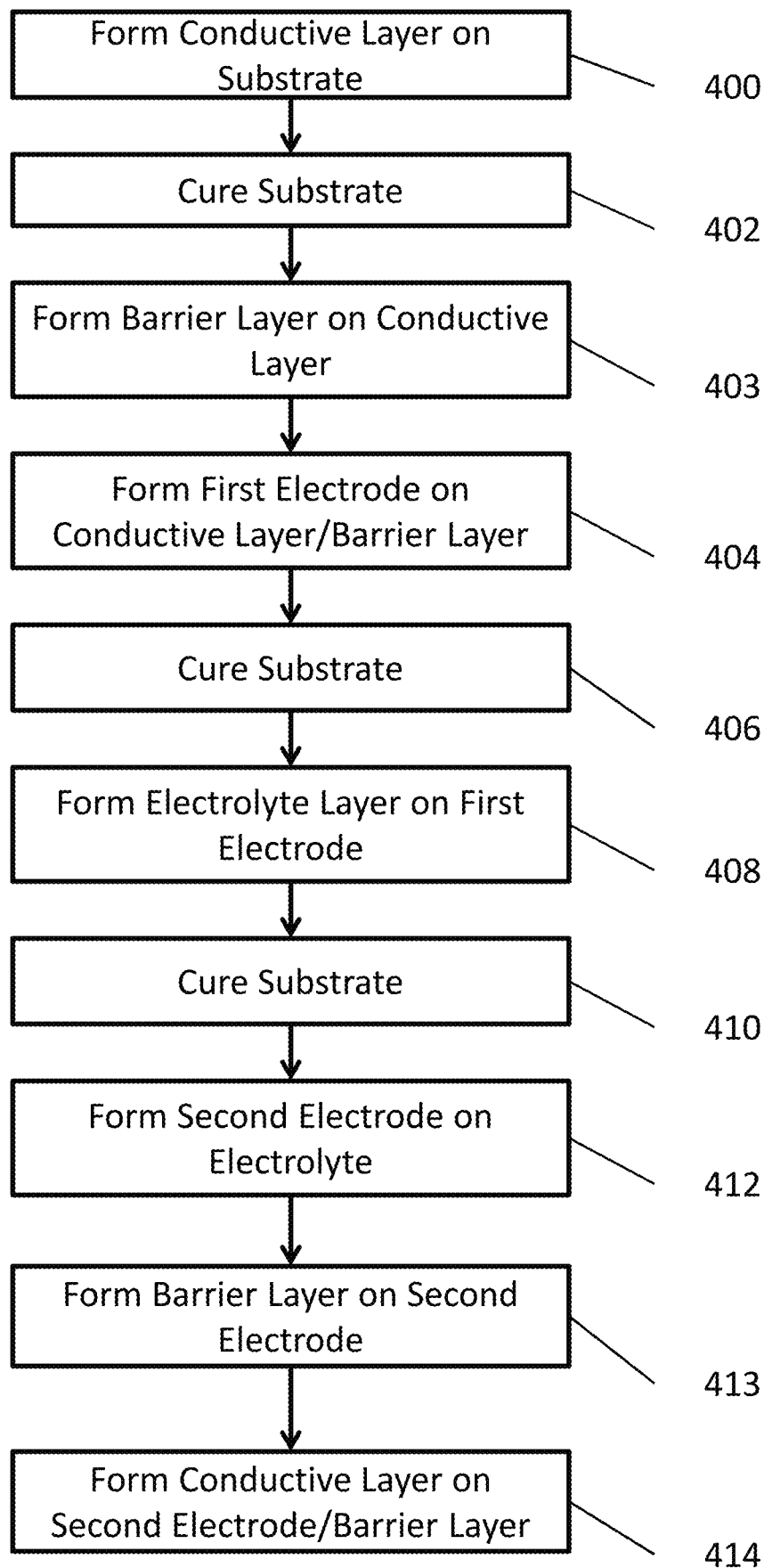
FIG. 4 is a flow diagram illustrating a method of manufacturing an EC pain unit, according to various embodiments of the present disclosure.

FIG. 4 is a flow diagram of a monolithic manufacturing process for forming an EC pane unit that includes an EC device disposed on a single substrate, according to various embodiments of the present disclosure. The method of FIG. 4 is similar to the method of FIG. 3, so only the differences therebetween will be discussed in detail.

Referring to FIG. 4, in step 400, the method includes forming a transparent conductive layer on a bare transparent substrate (e.g., a substrate that is not coated with a conductive layer), such as a glass or plastic substrate (e.g., window pane). The conductive layer may be formed by a solution deposition process. For example, the conductive layer may be formed by depositing electrically conductive metallic nanowires using a solution deposition process. The nanowires may be formed of silver, gold, or other metals. The nanowires may be deposited across the substrate so as to form a conductive mesh of electrically connected nanowires. The deposition solution may include a concentration of nanowires above the percolation threshold sufficient to form the conductive mesh, while remaining substantially invisible to the human eye.

In step 402, the substrate is cured. For example, the substrate may be heated to drive of any remaining solvents from the solution deposition of step 400, and/or to improve the electrical conductivity of the nanowires.

In step 403, a conductive barrier layer may be formed on the conductive layer. The barrier layer may be a passivation layer or a diffusion barrier layer configured to prevent electrochemical interactions between the conductive layer and an electrode formed thereon. The barrier layer may be formed by a sol-gel deposition method or may be formed by depositing barrier layer precursors. After deposition, the barrier layer may be cured by heating the substrate. However, in some embodiments, step 403 may be omitted, such as when the conductive is formed of a material that does not electrochemically interact with an electrode.

In step 404, a transparent first electrode may be formed on the barrier layer, if included, or may be formed directly on the conductive layer. The first electrode may be formed through solution deposition process and may have a nano-crystalline structure. The first electrode may operate as a working electrode or a counter electrode in a completed EC device.

In step 406, the substrate may be cured. For example, the substrate may be heated to drive of any remaining solvents from the solution deposition of step 404, and/or to improve the crystal structure of the first electrode.

In step 408, an electrolyte layer may be formed on the first electrode. For example, the electrolyte layer may be formed by a depositing a tantalum oxide layer using a sol-gel deposition process. However, the electrolyte layer may be formed of any suitable material having a high lithium ion conductivity.

In step 410, the substrate may be cured. For example, the substrate may be heated to drive of any remaining solvents from the sol-gel deposition of step 408 and/or to improve the crystal structure of the electrolyte layer.

In step 412, a transparent second electrode may be formed on the electrolyte. The second electrode may be a nano-crystalline layer formed through solution deposition process, as described with regard to step 404. The first and second electrodes may operate as different ones of a working electrode and a counter electrode in a completed EC device described in the prior embodiments.

In step 413, a conductive barrier layer may be formed on the second electrode. The conductive barrier layer may be formed and/or cured, as described with regard to the barrier layer of step 403. In some embodiments, step 413 may be omitted.

In step 414, a transparent, electrically conductive layer may be formed on barrier layer, if included or may be formed directly on the second electrode. For example, the conductive layer may be formed by a solution deposition method, as described with regard to step 400. In some embodiments, step 414 may also include curing the substrate, as described with regard to step 402.

In some embodiments, one or both of the curing steps may be omitted. For example, if sufficiently volatile solvents are used in preceding steps of the method, the corresponding curing steps may be omitted or conducted in a single step after all layers are deposited. In other embodiments, the method may further include assembling the EC pane unit into an EC window, by attaching the EC pane unit to another substrate, using a sealing separator, as discussed below.

Figure 5:
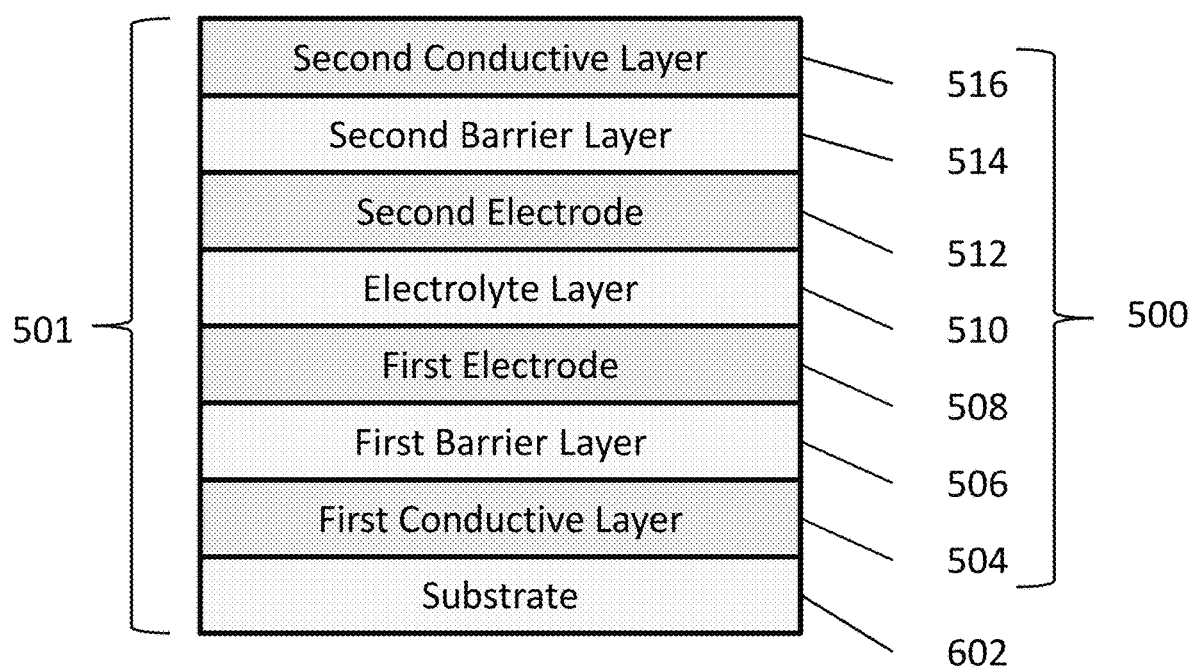
FIG. 5 is a top cross-sectional view of an EC pane unit, according to various embodiments of the present disclosure.

FIG. 5 is a schematic view illustrating a pane unit 501 that may be formed by the methods of FIGS. 3 and 4. Referring to FIG. 5, the pane unit 501 includes an EC device 500 disposed on a transparent substrate 602, such as a glass substrate. The EC device 500 includes a first conductive layer 504, a first electrode 508, an electrolyte layer 510, a second electrode 512, and a second conductive layer 516 that are successively stacked on the substrate 602.

The EC device 500 may optionally include a first barrier layer 506 disposed between the first conductive layer 504 and the first electrode 508, and a second barrier layer 514 disposed between the second electrode 512 and the second conductive layer 516. Although not shown, the EC device 500 may be covered with a removable coating, such as a plastic coating, in order to protect the EC device 500 and in particular, to protect the second conductive layer 516, before and during installation in an EC window (i.e., before a second window pane is formed above layer 516).

Figure 6:
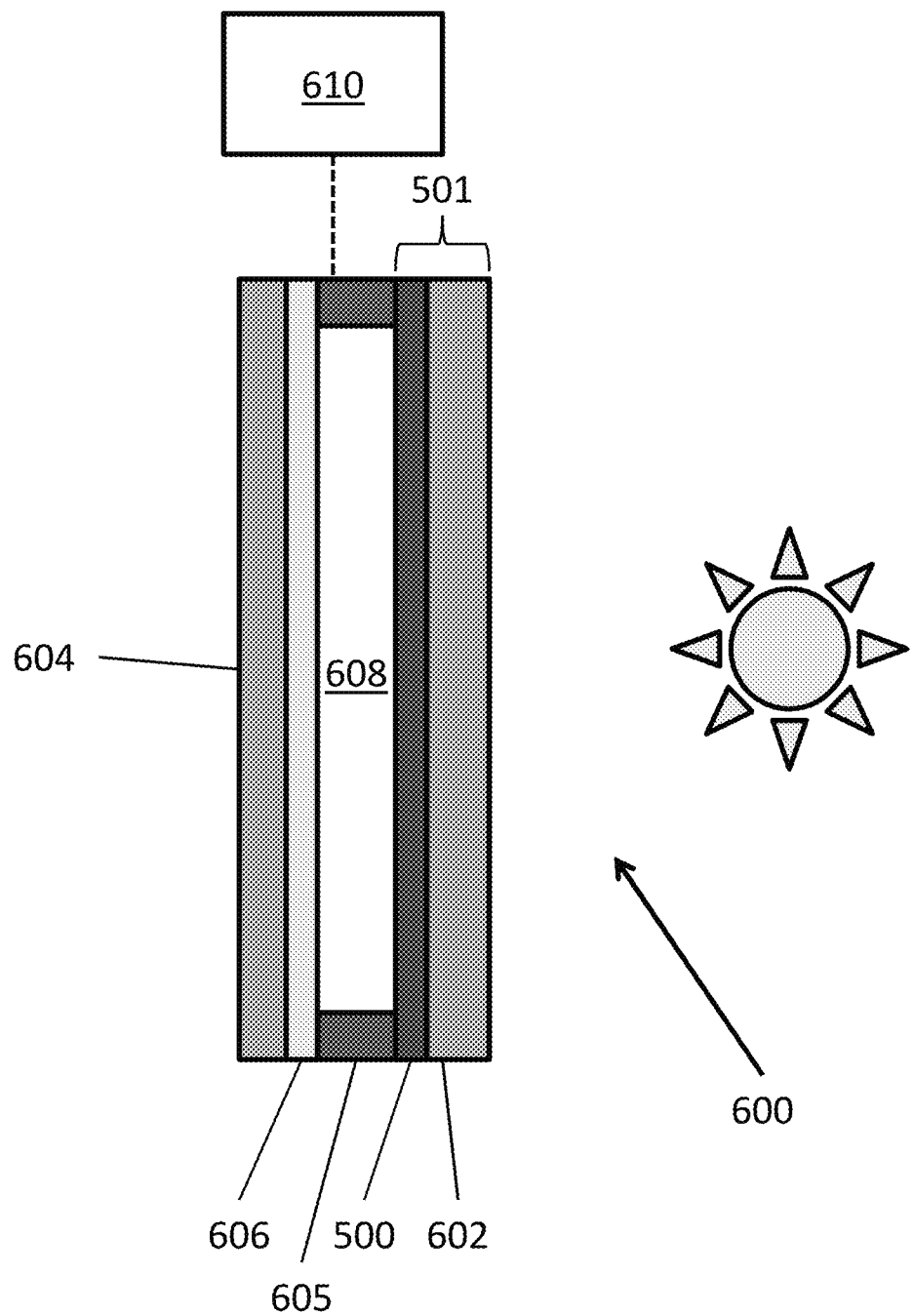
FIG. 6 is a top cross-sectional view of an EC window including an EC pane unit, according to various embodiments of the present disclosure.

FIG. 6 is a schematic view illustrating an EC window 600 including the pane unit 501 of FIG. 5, according to various embodiments of the present disclosure. In some embodiments, the methods of FIGS. 4 and 5 may also include assembling the pane unit 501 into an EC device.

Referring to FIG. 6, the EC pane unit 501 includes a first substrate 602 upon which an EC device 500 is disposed. The window 600 also includes a second substrate 604 that is connected to the first substrate 602 by a sealing separator 605, such that an internal space 608 is formed therebetween. The first and second substrates 602, 604 may be transparent substrates (e.g., window panes) formed of glass or plastic, for example.

The internal space 608 may be evacuated, or may be filled with an inert gas such as argon. In one embodiment, the space 608 is substantially liquid free. In one embodiment the space 608 is charged with an inert gas and is substantially liquid (e.g., moisture) free. In one embodiment, the space 608 has a moisture content of less than about <0.1 ppm.

The window 600 may be may be installed in a structure, such as a building or a vehicle, such that the second substrate 604 is exposed to an indoor environment, and the first substrate 602 is exposed to an outdoor environment as depicted by the Sun shown in FIG. 6.

The window 600 may be connected to a control unit 610 configured to control the transmittance of the EC device 500. The window 600 may also include a low emissivity (Low-E) coating 606 disposed on the second substrate 604. The Low-E coating 606 may be configured to minimize the amount of ultraviolet and infrared light that can pass through the window 600, without substantially compromising the amount of visible radiation that is transmitted there through. However, in some embodiments, the Low-E coating 610 may be disposed on an outer side of the second substrate 604, or may be disposed on inner or outer surfaces of the first substrate 602. In some embodiments, one or more of the substrates 602, 604 may be made of Low-E glass, and the Low-E coating 606 may be omitted.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

The invention claimed is:

1. A method of forming an electrochromic (EC) pane unit, comprising:
    forming a first conductive layer on a first substrate via a solution deposition process;
    forming a first electrically conductive barrier layer on first conductive layer via a sol-gel process or by depositing barrier layer precursors;
    forming a first electrode on the first electrically conductive barrier layer via a solution deposition process;
    forming an electrolyte layer on the first electrode via a sol-gel process;
    forming a second electrode on the electrolyte layer via a solution deposition process;
    forming a second electrically conductive barrier layer on the second electrode via a sol-gel process or by depositing barrier layer precursors; and
    forming a second conductive layer on the second electrically conductive barrier layer via a solution deposition process;
    optionally attaching the first substrate to a second substrate; and
    forming a low-emissive layer configured to reduce ultraviolet light transmission through the EC pane unit, on one of the first and second substrates, wherein:
    the first electrically conductive barrier layer is configured to prevent electrochemical reactions between the first conductive layer and the first electrode; and
    the second electrically conductive barrier layer is configured to prevent electrochemical reactions between the second conductive layer and the second electrode.

2. The method of claim 1, wherein the electrolyte layer comprises tantalum oxide or lithium phosphorus oxynitride.

3. The method of claim 1, further comprising curing at least one of the first electrode, the electrolyte layer, and the second electrode, using a thermal process.

4. The method of claim 3, wherein:
    the first and second electrodes are different ones of a working electrode and a counter electrode; and
    the working electrode is configured to assume a bright state and a dark state, the dark state having a lower visible light transmittance than the bright state.

5. The method of claim 1, wherein the first and second conductive layers comprise metallic nanowires and are substantially transparent to visible radiation.

6. The method of claim 5, wherein the nanowires of each of the first and second electrodes are disposed in the form of a mesh or grid.

7. The method of claim 5, wherein nanowires comprise silver or gold nanowires.

8. The method of claim 1, further comprising:
   curing the first conductive layer using a thermal process, prior to forming the first electrode; and
   curing the second conductive layer using a thermal process.

9. The method of claim 1, further comprising:
   attaching the first substrate to the second substrate using a sealing separator, such that an internal space is formed between the first substrate and the second substrate.

10. The method of claim 9, further comprising evacuating the internal space or filling the internal space with an inert gas.

* * * * *